United States Patent
Herman (10) Patent No.: US 11,073,544 B2
(45) Date of Patent: Jul. 27, 2021

(54) SYSTEM AND METHOD TO MEASURE AND ADJUST A CHARGE OF A WORKPIECE

(71) Applicant: Advanced Energy Industries, Inc., Fort Collins, CO (US)

(72) Inventor: Donnie Herman, Olcott, NY (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 54 days.

(21) Appl. No.: 16/420,924

(22) Filed: May 23, 2019

(65) Prior Publication Data

US 2020/0371147 A1  Nov. 26, 2020

(51) Int. Cl.
  *G01R 29/24* (2006.01)
  *G01R 19/155* (2006.01)
  *G01R 29/12* (2006.01)

(52) U.S. Cl.
  CPC .......... *G01R 29/24* (2013.01); *G01R 19/155* (2013.01); *G01R 29/12* (2013.01)

(58) Field of Classification Search
  CPC ....... G01R 29/24; G01R 29/12; G01R 19/155
  USPC ...................................................... 324/458
  See application file for complete search history.

(56) References Cited

U.S. PATENT DOCUMENTS

| | | | | |
|---|---|---|---|---|
| 4,083,044 A * | 4/1978 | Marshall, III | ........... | H03K 7/06 341/157 |
| 5,285,241 A * | 2/1994 | Scheuer | ............. | G03G 15/5037 399/48 |
| 5,424,677 A * | 6/1995 | Carson | ................ | H03F 3/45479 330/2 |
| 5,475,319 A * | 12/1995 | Hirae | ...................... | G01R 29/24 850/27 |
| 6,163,448 A * | 12/2000 | Hausmann | .......... | H01L 21/6833 361/234 |
| 6,254,738 B1 * | 7/2001 | Stimson | .................... | H03H 7/38 204/192.12 |
| 6,579,426 B1 * | 6/2003 | van Gogh | ............... | H01F 29/10 204/192.25 |
| 7,813,103 B2 * | 10/2010 | Shannon | ............. | H01L 21/6833 361/234 |
| 2005/0162175 A1 * | 7/2005 | Maeno | .................... | G01R 29/24 324/762.05 |
| 2005/0185171 A1 * | 8/2005 | Samukawa | ....... | H01J 37/32963 356/237.1 |
| 2006/0063284 A1 * | 3/2006 | Shuto | ................ | H01J 37/32091 438/15 |
| 2006/0288794 A1 * | 12/2006 | Hardwicke | ........... | G01L 1/2287 73/763 |

(Continued)

FOREIGN PATENT DOCUMENTS

WO  2015120419 A1  8/2015

*Primary Examiner* — Christopher P McAndrew
(74) *Attorney, Agent, or Firm* — Neugeboren O'Dowd PC (57) ABSTRACT

An apparatus and method for managing an electrostatic charge of a workpiece are disclosed. The method includes coupling an electrostatic voltmeter to a conductor, coupling a charge-adjustment system to the conductor, and coupling the conductor to the workpiece. A level of charge in the workpiece is adjusted, via the conductor, with the charge-adjustment circuit and a voltage of the workpiece is monitored, via the conductor, with the electrostatic voltmeter. A controller may be used to adjust the charge on the workpiece based upon the monitored voltage.

8 Claims, 5 Drawing Sheets

(56) References Cited

U.S. PATENT DOCUMENTS

2009/0058424 A1* 3/2009 Tatsumi .............. C23C 16/50
                                                    324/464

* cited by examiner

SYSTEM AND METHOD TO MEASURE AND ADJUST A CHARGE OF A WORKPIECE

BACKGROUND

Field

The present disclosure relates generally to processing workpieces, and more specifically, to managing electrostatic charge on workpieces.

Background

There are currently many technologies for processing workpieces to obtain desired, improved end products. As used herein, the term workpiece includes any of a variety of structures that can hold an electrostatic charge. Examples of workpieces include, without limitation, semiconductor wafers, photovoltaic panels, liquid crystal display panels, and glass panels. Workpieces may be processed using a variety of different techniques including, for example, a variety of etch techniques and deposition techniques that are well known in the art.

In many instances, it is desirable to discharge a workpiece to prevent an inadvertent discharge that may damage the workpiece. For example, the workpiece may be grounded to remove charge; thus, preventing any undesirable discharge from the workpiece. In other instances, it is desired to control a level of charge at a surface of a workpiece to enhance or optimize processing of the workpiece.

Electrostatic voltmeters (ESVMs) are available to measure a voltage at a surface of a workpiece, but these ESVMs are typically high impedance devices that are specifically designed to avoid changing the level of charge on the surface of a workpiece. Thus, ESVMs are implemented as separate devices (from any workpiece-discharge-mechanisms that may be employed), and as a consequence, in the art of workpiece processing, there is currently a lack of monitoring and control of electrostatic charges on the surfaces of workpieces.

SUMMARY

According to an aspect, a method for managing an electrostatic charge of a workpiece is disclosed. The method includes coupling an electrostatic voltmeter to a conductor, coupling a charge-adjustment system to the conductor, and coupling the conductor to the workpiece. A level of charge in the workpiece is adjusted, via the conductor, with the charge-adjustment circuit and a voltage of the workpiece is monitored, via the same conductor, with the electrostatic voltmeter.

According to another aspect, an apparatus for managing an electrostatic charge of a workpiece is disclosed. The apparatus includes a conductor configured to couple to the workpiece, an electrostatic voltmeter coupled to the conductor, and a charge-adjustment circuit coupled to the same conductor. The charge-adjustment circuit includes a voltage source coupled to the conductor via a switch. A controller is coupled to the switch, and the controller is configured to close the switch to adjust, via the conductor, a level of charge in the workpiece with the charge-adjustment system. In addition, the controller is configured to open the switch to monitor, via the conductor, a voltage of the workpiece with the electrostatic voltmeter.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1:
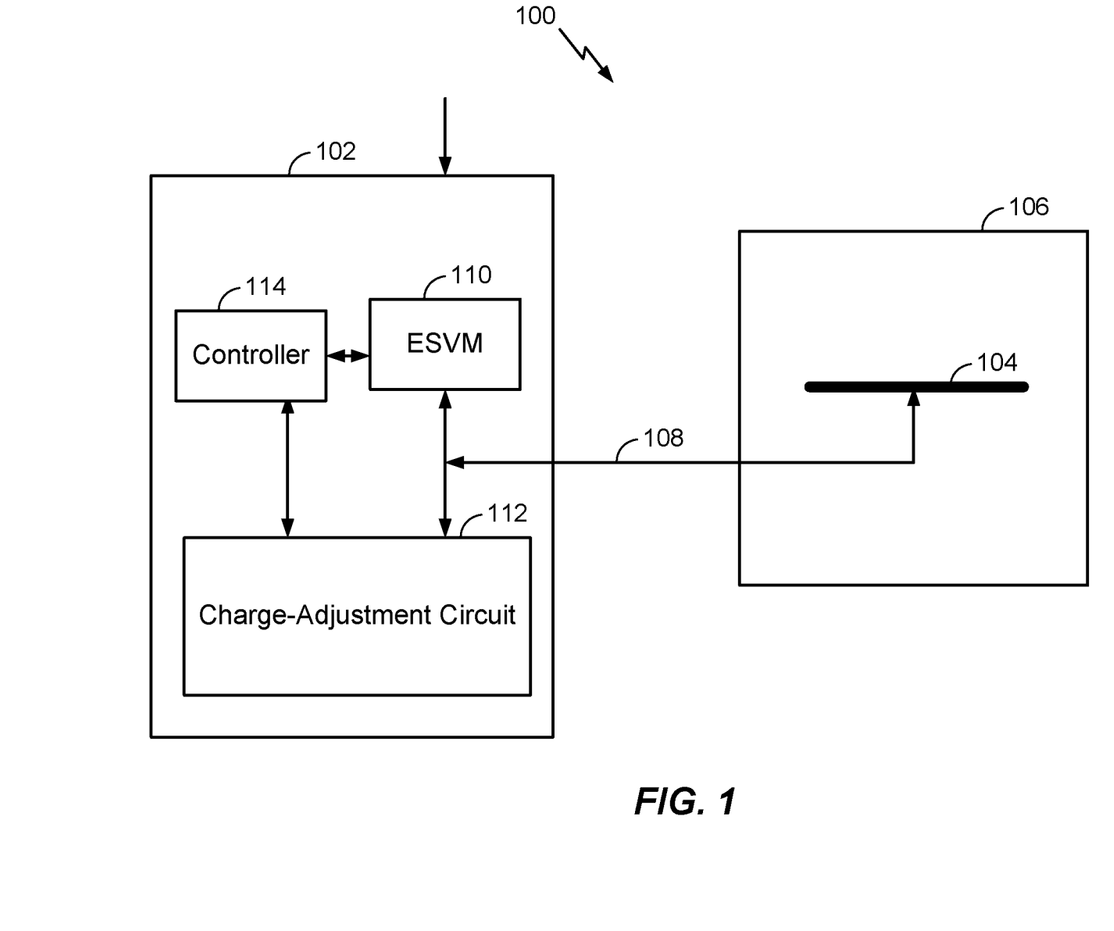
FIG. 1 is a block diagram depicting an environment in which aspects of the present invention may be implemented.

Referring first to FIG. 1, shown is a block diagram depicting an environment 100 in which an exemplary charge manager 102 may be implemented. As shown, the charge manager 102 is coupled to a workpiece 104 within a processing chamber 106 (e.g., a plasma processing chamber) via a conductor 108, and the charger manager 102 includes an electrostatic voltmeter (ESVM) 110, a charge-adjustment circuit 112, and a controller 114 coupled to both, the ESVM 110 and the charge adjustment circuit 112.

The charge manager 102 may be realized as a separate, unitary device that may be added as a separate component in the environment 100 of FIG. 1. As an example, the electrostatic voltmeter (ESVM) 110, the charge-adjustment circuit 112, and the controller 114 of the charge manager 102 may be implemented within a common housing that is separate from other devices.

Alternatively, the electrostatic voltmeter (ESVM) 110, the charge-adjustment circuit 112, and the controller 114 of the charge manager 102 may be distributed such that one or more components reside within separate housings or separate devices. In other implementations, the electrostatic voltmeter (ESVM) 110, the charge-adjustment circuit 112, and the controller 114 of the charge manager 102 may be integrated within another device such as, for example, a match network, a bias supply (that applies a bias voltage to the workpiece 104, or a plasma supply (e.g., an RF generator used to ignite and sustain a plasma).

In general, the charge-adjustment circuit 112 is configured to adjust, via the conductor 108, a level of charge in the workpiece 104. As discussed further herein, the charge-adjustment circuit 112 may be capable of discharging the workpiece 104 and/or charging the workpiece 104. For example, the charge adjustment circuit may operate to reduce a surface voltage of the workpiece 104 to zero volts, and it may also operate to induce a charge on the workpiece 104 if it is desirable to do so in a particular application or test.

As another example, instead of discharging the surface of the workpiece 104 to zero volts, the charge-adjustment circuit 112 may discharge (or charge) the surface to a DC offset of any value in the range of voltages used in the charge manager 102. The ability to effectuate a DC offset at the surface of the workpiece 104 may be useful to test the charge characteristics and discharge characteristics of the workpiece 104. For example, the charge-adjustment circuit 112 may be used to place a starting charge on the surface of the workpiece 104, and then the ESVM 110 may be used to observe the charge decay or charge behavior over time. After a period of observation, the workpiece 104 may be discharged to 0V, and then the test may be performed again with the same or different DC offset voltage.

The ESVM 110 is generally configured to monitor a voltage of the workpiece 104. The ESVM 110 may be realized by a variety of different topologies, but in general, when engaged and coupled to the workpiece 104, the ESVM 110 is a high impedance device that monitors the voltage of the workpiece 104 without substantially affecting the voltage of the workpiece 104.

The controller 114 generally operates, as discussed in more detail further herein, to control the ESVM 110 and charge-adjustment circuit 112 to enable both, monitoring and control of electrostatic charges on a surface of the workpiece 104. This control beneficially increases the visibility and control of the electrostatics in the processing chamber 106.

Although depicted within the charge manager 102, the controller 114 need not reside within a common housing with the ESVM 110 and the charge-adjustment circuit 112. For example, the controller 114 may be implemented as a part of a centralized controller (e.g., a centralized plasma processing controller), or the controller 114 may be remotely located and operate to control the ESVM 110 and the charge-adjustment circuit 112 via network connection. As yet another example, the controller 114 may be realized as a portion of the ESVM 110 and/or a portion of the charge-adjustment circuit 112. As discussed in more detail with reference to FIG. 5, the controller 114 may include a user-interface to enable a user to control the monitoring, charging, and/or discharging of the workpiece 104. Alternatively, or in addition to the user-interface, the controller may have a control input to enable a user to control operation of the controller 114 via a remote user-interface.

An aspect of many embodiments of the charge manager 102 is that the ESVM 110 and the charge-adjustment circuit 112 are both coupled to the workpiece 104 via the same conductor 108. As a consequence, the charge manager 102 may be easily installed in a processing system with minimal intrusion into the processing chamber 106.

The conductor 108 may be realized, in part, by a coaxial cable that extends from an output of the charge controller 102. As shown in FIG. 1, the ESVM 110 and the charge-adjustment circuit 112 may couple to the conductor 108 within the charge controller 102; thus, the conductor 108 may include a coaxial cable, a connector extending through a housing of the charge controller 102, and a conductive element on an internal side of the connector.

The conductor 108 may be directly coupled to the workpiece 104 or indirectly coupled to the workpiece 104. For example, a disc-electrode may be used to capacitively couple the conductor 108 to the workpiece 104.

Figure 2:
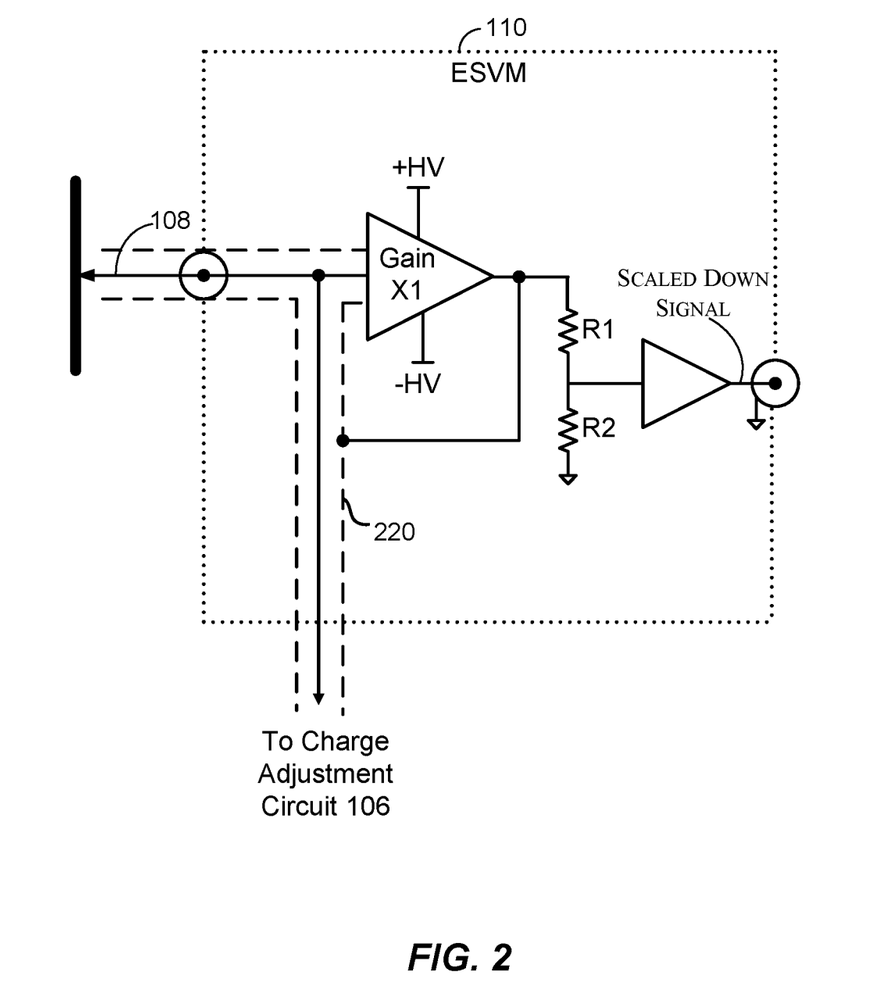
FIG. 2 is a schematic drawing of an exemplary implementation of the electrostatic voltmeter depicted in FIG. 1.

Referring next to FIG. 2, shown is an exemplary embodiment of the ESVM 104. As shown, the ESVM 104 in this embodiment includes a connector (e.g., a subminiature version C (SMC) connector) to conductively couple the conductor 108 to the charge adjustment circuit 106 and high voltage amplifier within the ESVM. The high voltage amplifier of the ESVM may be configured to amplify the monitored voltage in a 1:1 ratio in range from −HV to +HV where HV may be set depending upon the particular application. For example, HV may be at least 500 volts in some implementations, and may be at least 1000 volts in other implementations. In yet other implementations, HV may be 10,000 volts, but an aspect of the present disclosure is that the monitored voltage at the workpiece 104 may even exceed 100,000 volts; thus, it is contemplated that HV may be greater than 100,000 volts.

As shown, the output of the high voltage amplifier of the ESVM feeds to a voltage divider (implemented by resistors R1 and R2) that effectuates a reduced voltage at the input of a simple buffer that, in turn, provides a scaled down signal (e.g., ±10V) to an output connector (e.g., SMC connector) that is indicative of a voltage of the workpiece 104. In addition, the output of the high voltage amplifier may be coupled to a shield 220 so that the shield 220 is driven to a voltage that is substantially the same as the voltage of the conductor 108. As those of ordinary skill in the art will appreciate, the shield 220 may be an outer conductor of a coaxial cable and the conductor 108 may be an inner conductor of the coaxial cable.

Figure 3:
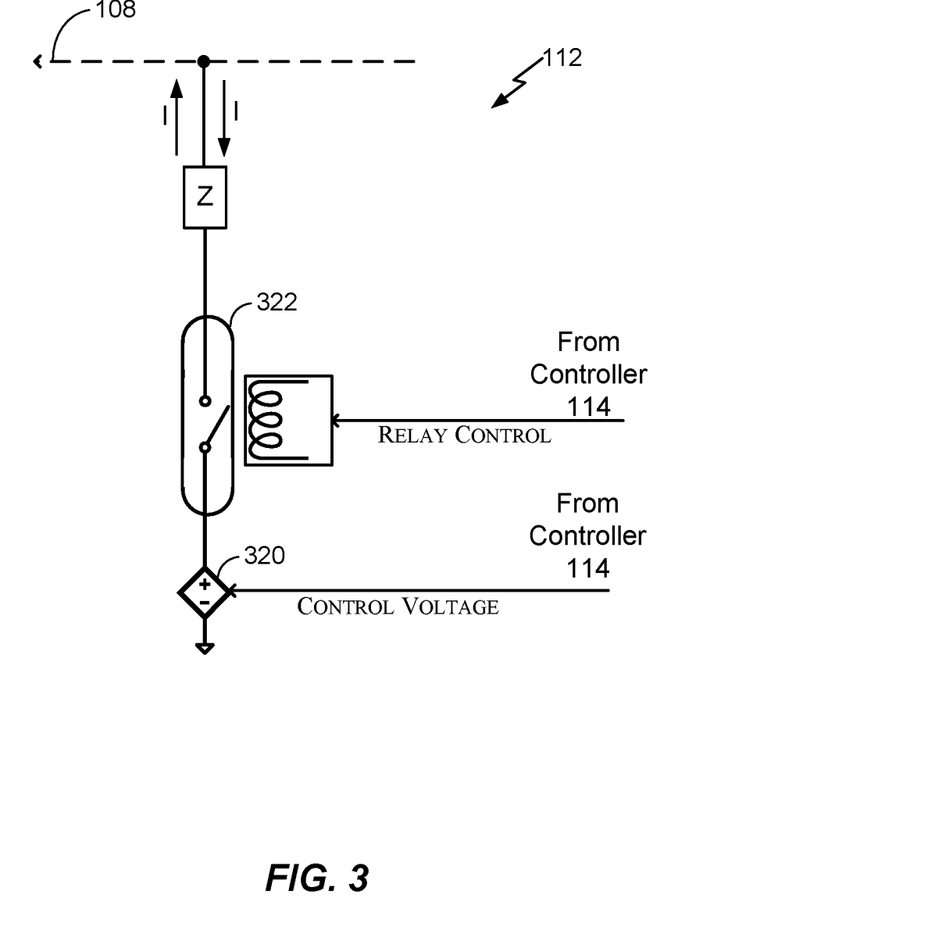
FIG. 3 is a schematic drawing of an exemplary implementation of the charge-adjustment circuit depicted in FIG. 1.

Referring next to FIG. 3, shown is a schematic representation of an exemplary implementation of the charge-adjustment circuit 112. As shown, the charge-adjustment circuit 112 in this embodiment includes a voltage source 320 coupled to the conductor 108 via a switch 322. In addition, shown is an impedance, Z, disposed between the switch 106 and the conductor 108.

In general, the voltage source 320 functions to enable, when the switch 322 is closed, the workpiece 104 to be charged and/or discharged to one or more desired charge levels. In some embodiments, the voltage source 320 may be implemented as a DC voltage source, and in other implementations, the voltage source 320 may be implemented as a voltage source capable of applying an arbitrary, time varying, voltage function. Those of ordinary skill in the art will appreciate that there are a variety of different types of voltage sources (e.g., linear and switch-mode voltage sources) that may be used to realize the voltage source 320; thus, additional details of well-known voltage sources are not provided herein. As shown, the voltage source 320 may be coupled to the controller 114 to enable the controller 114 to provide a control voltage to control the voltage of the voltage source 320 and/or the voltage waveform applied by the voltage source 320.

As shown, the depicted switch 322 may be realized as a low leakage switch (such as a reed switch). An exemplary reed switch that may be used is model No. KSK-1A85-3025 sold under the trade name STANDEX ELECTRONICS. In addition, the switch 322 may be implemented as part of a relay that enables the switch 322, responsive to a relay control signal from the controller 114, to be opened and closed by applying and removing a magnetic field to the switch 322.

In some implementations, the impedance, Z, may be realized as a resistance (e.g., a resistance from 1 kilo-ohms to 100 Tera-ohms), which helps to provide a soft transition when changing between states where the switch 322 is opened and closed. This resistance may also factor into the charge and decay rates when experimenting.

Figure 4:
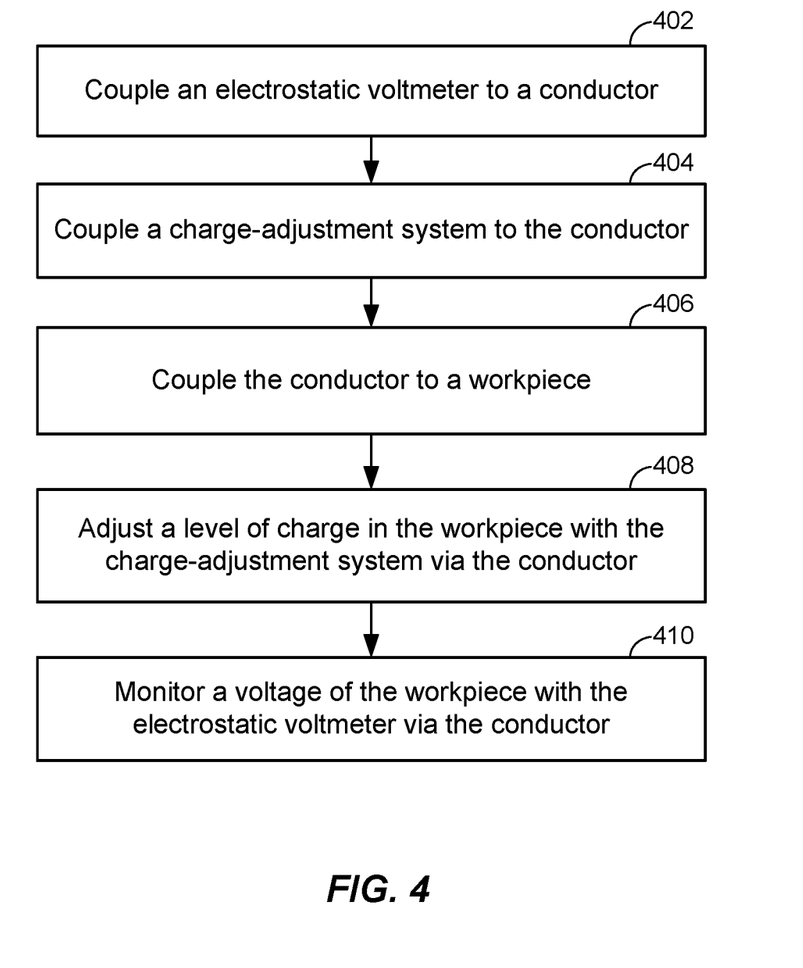
FIG. 4 is a flowchart depicting a method that may be traversed in connection with embodiments disclosed herein.

Referring next to FIG. 4, shown is a flowchart depicting a method that may be traversed in connection with embodiments disclosed herein. As shown, the method includes coupling the electrostatic voltmeter 110 to the conductor 108 (Block 402), switchably coupling the charge-adjustment circuit 112 to the conductor 108 (Block 404), and coupling the conductor 108 to the workpiece 104 (Block 406). A level of charge in the workpiece 104 is adjusted, via the conductor 108, with the charge-adjustment circuit (Block 408), and a voltage of the workpiece 104 is monitored, via the conductor, with the electrostatic voltmeter (Block 410). Thus, both monitoring and control of electrostatic charge on the surface of the workpiece 104 is provided.

It should be recognized that the order of the depicted actions in FIG. 4 may be altered without departing from the scope of the claimed invention. For example, the workpiece voltage may be monitored first (at Block 410) and used as feedback to adjust the level of charge in the workpiece 104 (at Block 408). As an example, before the switch 322 is closed, a voltage applied by the voltage source 320 may be set so that it is equal the voltage of the workpiece 104, and after setting the voltage of the voltage source 320 (to be equal to the voltage of the workpiece 104), the switch 322 may be closed, and the voltage source 320 may be adjusted to adjust (e.g., to decrease or increase) the level of charge in the workpiece 104. This type of controlled charge adjustment mitigates against electrical disruptions that may otherwise occur if there is a substantial potential difference between the workpiece 104 and the voltage applied by the voltage source 320 when the switch 322 is closed.

Control over the voltage source 320 also beneficially enables an operator to experiment with the application of different voltages to the workpiece 104 to assess how to best control the level of charge on the workpiece 104. In addition, the effects that different charge levels on the workpiece 104 may have upon the processing of the workpiece 104 may be easily assessed.

Figure 5:
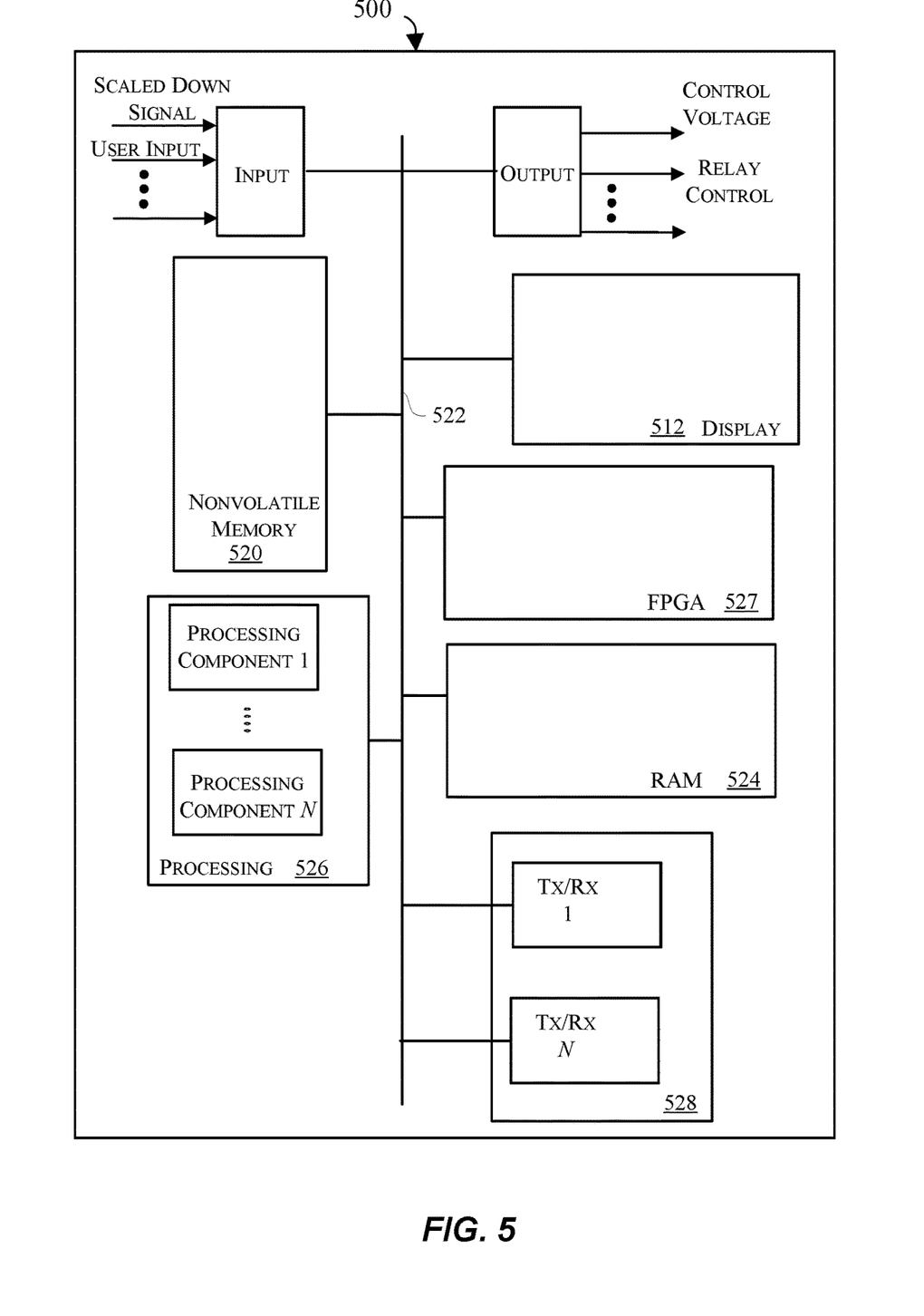
FIG. 5 is a block diagram depicting exemplary processing components that may be used to realize some embodiments disclosed herein.

The methods described in connection with the embodiments disclosed herein may be embodied directly in hardware, in processor executable instructions encoded in non-transitory machine readable medium, or as a combination of the two. Referring to FIG. 5 for example, shown is a block diagram depicting physical components of an exemplary controller 500 that may be utilized to realize the controller 114 according to an illustrative embodiment of this disclosure. As shown, in this embodiment a display 512 and nonvolatile memory 520 are coupled to a bus 522 that is also coupled to random access memory ("RAM") 524, a processing portion (which includes N processing components) 526, a field programmable gate array (FPGA) 527, and a transceiver component 528 that includes N transceivers. Although the components depicted in FIG. 5 represent physical components, FIG. 5 is not intended to be a detailed hardware diagram; thus, many of the components depicted in FIG. 5 may be realized by common constructs or distributed among additional physical components. Moreover, it is contemplated that other existing and yet-to-be developed physical components and architectures may be utilized to implement the functional components described with reference to FIG. 5.

The display 512 generally operates to provide a user interface for a user, and in several implementations, the display 512 is realized by a touchscreen display. For example, display 512 can be used to control and interact with the ESVM 110 and the charge-adjustment circuit 112. For example, the display 512 may display the voltage of the workpiece 104 and may enable control over the charge adjustment to the workpiece 104. In general, the nonvolatile memory 520 is non-transitory memory that functions to store (e.g., persistently store) data and machine readable (e.g., processor executable) code (including executable code that is associated with effectuating the methods described herein). In some embodiments, for example, the nonvolatile memory 520 includes bootloader code, operating system code, file system code, and non-transitory processor-executable code to facilitate the execution of the methods described herein including the method described with reference to FIG. 4.

In many implementations, the nonvolatile memory 520 is realized by flash memory (e.g., NAND or ONENAND memory), but it is contemplated that other memory types may also be utilized. Although it may be possible to execute the code from the nonvolatile memory 520, the executable code in the nonvolatile memory is typically loaded into RAM 524 and executed by one or more of the N processing components in the processing portion 526.

In operation, the N processing components in connection with RAM 524 may generally operate to execute the instructions stored in nonvolatile memory 520 to realize aspects of the functionality of the controller 114. For example, non-transitory processor-executable instructions to effectuate the methods described with reference to FIG. 4 may be persistently stored in nonvolatile memory 520 and executed by the N processing components in connection with RAM 524. As one of ordinary skill in the art will appreciate, the processing portion 526 may include a video processor, digital signal processor (DSP), graphics processing unit (GPU), and other processing components.

In addition, or in the alternative, the field programmable gate array (FPGA) 527 may be configured to effectuate one or more aspects of the methodologies described herein. For example, non-transitory FPGA-configuration-instructions may be persistently stored in nonvolatile memory 520 and accessed by the FPGA 527 (e.g., during boot up) to configure the FPGA 527 to effectuate the functions of the controller 114.

In general, the input component functions to receive analog and/or digital signals that may be utilized by the controller 500 as described herein. It should be recognized that the input component may be realized by several separate analog and/or digital input processing chains, but for simplicity, the input component is depicted as a single functional block. In operation, the input component may operate to receive signals (e.g., the scaled down signal from the ESVM 104) that are indicative of the voltage of the workpiece 104. As shown, the input component may also receive a user input to enable the user to control the charge adjustment circuit 112 and/or the ESVM 110. The output component generally operates to provide one or more analog or digital signals to effectuate one or more operational aspects of the ESVM 110 and the charge-adjustment circuit 112. For example, the output portion may provide the control voltage to the voltage source 320 and the relay control signal to the relay as described with reference to FIG. 3.

The depicted transceiver component 528 includes N transceiver chains, which may be used for communicating with external devices via wireless or wireline networks. Each of the N transceiver chains may represent a transceiver associated with a particular communication scheme (e.g., WiFi, ethernet, universal serial bus, profibus, etc.).

In yet alternative implementations, the controller 114 may be realized by a microcontroller or an application-specific integrated circuit.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for managing an electrostatic charge of a workpiece, the method comprising:
coupling an electrostatic voltmeter to a conductor;

coupling a charge-adjustment circuit to the conductor;
coupling the conductor to the workpiece;
adjusting, via the conductor, a level of charge in the workpiece with the charge-adjustment circuit, wherein the adjusting comprises:
    setting a voltage of a voltage source to equal the voltage of the workpiece; and
    after setting the voltage of the voltage source to equal the voltage of the workpiece, adjusting the voltage source to adjust the level of charge in the workpiece; and
monitoring, via the conductor, a voltage of the workpiece with the electrostatic voltmeter.

2. The method of claim 1, wherein adjusting includes discharging the workpiece.

3. The method of claim 1, wherein adjusting includes charging the workpiece.

4. The method of claim 1, wherein coupling the conductor to the workpiece includes indirectly coupling the conductor to the workpiece.

5. An apparatus for managing an electrostatic charge of a workpiece, the apparatus comprising:
    a conductor configured to couple to the workpiece;
    an electrostatic voltmeter coupled to the conductor;
    a charge-adjustment circuit coupled to the conductor, the charge-adjustment circuit including a voltage source coupled to the conductor via a switch;
    a controller coupled to the switch and configured to:
        receive, from the electrostatic voltmeter, an indication of a voltage of the workpiece;
        close the switch to adjust, via the conductor, a level of charge in the workpiece with the charge-adjustment circuit by controlling the voltage source based upon the voltage of the workpiece; and
        open the switch to monitor, via the conductor, the voltage of the workpiece with the electrostatic voltmeter;
    wherein the controller is configured to set a voltage of the voltage source to be equal to the voltage of the workpiece, close the switch, and then adjust the voltage source.

6. The apparatus of claim 5 wherein the switch includes a low leakage switch.

7. The apparatus of claim 6, wherein the low leakage switch includes a reed switch.

8. The apparatus of claim 5, wherein the voltage source includes a variable voltage source.

* * * * *